US006863491B2

(12) United States Patent
Cheng et al.

(10) Patent No.: US 6,863,491 B2
(45) Date of Patent: Mar. 8, 2005

(54) CATCH-PIN WATER SUPPORT FOR PROCESS CHAMBER

(75) Inventors: Hsi-Kuei Cheng, Hsinchu (TW);
Chun-Tse Lin, Hsin Chu (TW);
Ting-Chun Wang, Taoyuan (TW);
Yu-Ku Lin, Hsin-Chu (TW);
Ying-Lang Wang, Tai-Chung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 44 days.

(21) Appl. No.: 10/339,691

(22) Filed: Jan. 8, 2003

(65) Prior Publication Data

US 2004/0131460 A1 Jul. 8, 2004

(51) Int. Cl.[7] ............................................... B23B 31/16
(52) U.S. Cl. .................... 414/744.5; 294/116; 269/268; 279/2.09; 279/4.12; 279/110
(58) Field of Search ............................. 414/744.5, 935; 294/116; 198/345.1; 269/268; 279/2.09, 2.1, 4.12, 110; 901/8

(56) References Cited

U.S. PATENT DOCUMENTS

| 2,807,373 A | * | 9/1957 | Couser ..................... 901/37 X |
| 3,123,230 A | * | 3/1964 | Oppenheimer et al. ... 901/37 X |
| 4,828,276 A | * | 5/1989 | Link et al. ............... 279/110 X |
| 5,556,085 A | * | 9/1996 | Cyr ............................. 269/75 |

* cited by examiner

Primary Examiner—Donald W. Underwood
(74) Attorney, Agent, or Firm—Tung & Associates

(57) ABSTRACT

A new and improved wafer support for supporting wafers in a process chamber such as an edge bead removal (EBR) chamber. The wafer support comprises multiple wafer support units each including a gripper block that engages an edge portion or bevel of the wafer. The gripper block is attached to an engaging and disengaging mechanism for selectively causing engagement of the gripper blocks with the wafer to support the wafer and disengagement of the gripper blocks from the wafer to release the wafer for removal of the wafer from the chamber. The gripper blocks contact little or none of the surface area on the patterned surface of the wafer to prevent or substantially reduce the formation of contact-induced defects on the wafer.

19 Claims, 2 Drawing Sheets

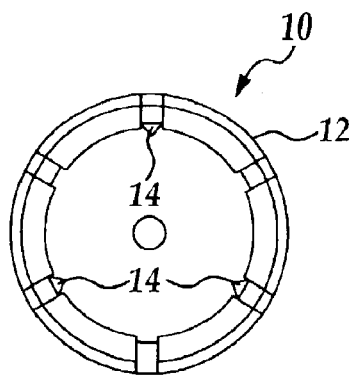
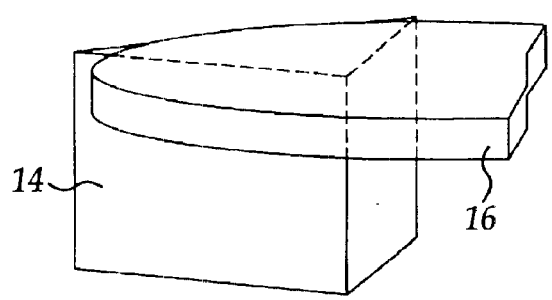
Figure 1
Prior Art
Figure 1A
Prior Art
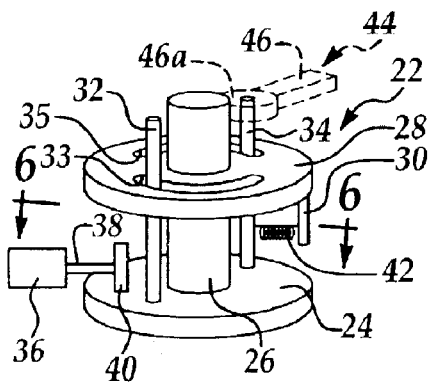
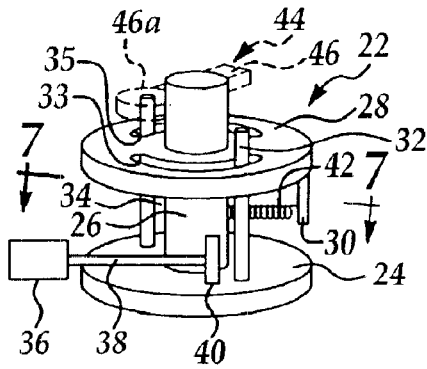
Figure 2
Figure 2A
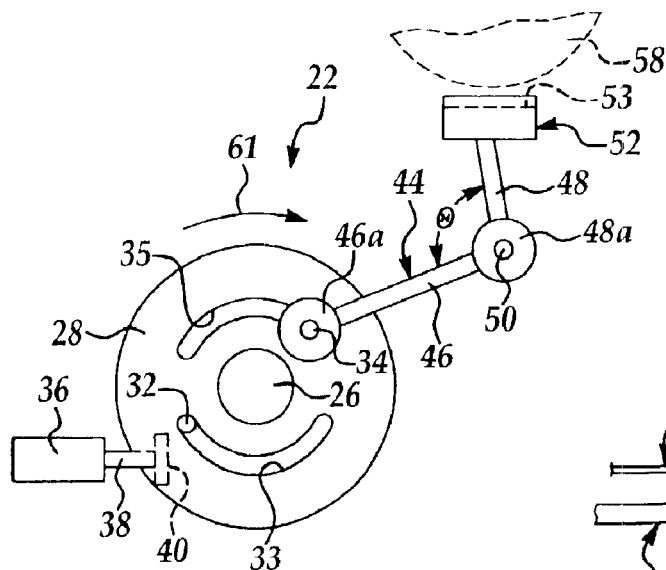
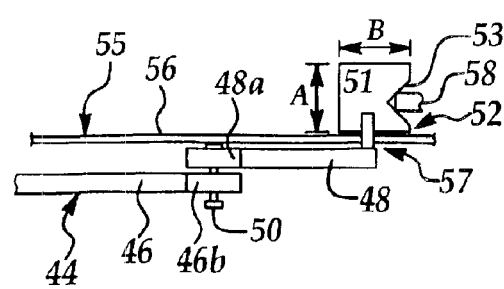
Figure 3
Figure 4

CATCH-PIN WATER SUPPORT FOR PROCESS CHAMBER

FIELD OF THE INVENTION

The present invention relates to electrochemical mechanical deposition (ECMD) systems used in the deposition of metal layers on semiconductor wafer substrates in the fabrication of semiconductor integrated circuits. More particularly, the present invention relates to a new and improved wafer support for an edge bead removal (EBR) chamber in an electrochemical plating (ECP) system, which wafer support engages the edges of the wafer to prevent contact-induced defects on the patterned surface of the wafer.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Deposition of conductive layers on the wafer substrate can be carried out using any of a variety of techniques. These include oxidation, LPCVD (low-pressure chemical vapor deposition), APCVD (atmospheric-pressure chemical vapor deposition), and PECVD (plasma-enhanced chemical vapor deposition). In general, chemical vapor deposition involves reacting vapor-phase chemicals that contain the required deposition constituents with each other to form a nonvolatile film on the wafer substrate. Chemical vapor deposition is the most widely-used method of depositing films on wafer substrates in the fabrication of integrated circuits on the substrates.

Due to the ever-decreasing size of semiconductor components and the ever-increasing density of integrated circuits on a wafer, the complexity of interconnecting the components in the circuits requires that the fabrication processes used to define the metal conductor line interconnect patterns be subjected to precise dimensional control. Advances in lithography and masking techniques and dry etching processes, such as RIE (Reactive Ion Etching) and other plasma etching processes, allow production of conducting patterns with widths and spacings in the submicron range. Electrodeposition or electroplating of metals on wafer substrates has recently been identified as a promising technique for depositing conductive layers on the substrates in the manufacture of integrated circuits and flat panel displays. Such electrodeposition processes have been used to achieve deposition of the copper or other metal layer with a smooth, level or uniform top surface. Consequently, much effort is currently focused on the design of electroplating hardware and chemistry to achieve high-quality films or layers which are uniform across the entire surface of the substrates and which are capable of filling or conforming to very small device features. Copper has been found to be particularly advantageous as an electroplating metal.

Electroplated copper provides several advantages over electroplated aluminum when used in integrated circuit (IC) applications. Copper is less electrically resistive than aluminum and is thus capable of higher frequencies of operation. Furthermore, copper is more resistant to electromigration (EM) than is aluminum. This provides an overall enhancement in the reliability of semiconductor devices because circuits which have higher current densities and/or lower resistance to EM have a tendency to develop voids or open circuits in their metallic interconnects. These voids or open circuits may cause device failure or burn-in.

Electrochemical mechanical deposition (ECMD) is a technique which has been developed recently for plating a conductive material on a semiconductor wafer or workpiece surface. One goal of ECMD is to uniformly fill holes and trenches on the wafer/workpiece surface with the conductive material while maintaining the planarity of the surface. During the ECMD process, a conductive material, such as copper from a typically copper anode, is applied in holes, trenches and/or other desired areas on the wafer using an electrolyte solution in the anode assembly. The electrolyte solution flows from the anode and the copper cations from the anode are reduced to form a copper layer on the wafer.

After the electrochemical plating process, the wafer is normally subjected to an edge bead removal, or edge bevel removal (EBR), process to remove residual copper precipitate and electrolytes from the wafer. In the EBR process, the wafer is contained in an EBR chamber and subjected to a three-step cleaning process. The first step involves rinsing the wafer with deionized water to remove residual copper electrolytes from the wafer. In a second step, the edges of the wafer are rinsed with a cleaning solution, such as sulfuric acid ($H_2SO_4$), to remove copper precipitate from the wafer edge. Finally, the wafer is again rinsed with deionized water to remove the cleaning solution from the wafer. During the EBR process, the wafer is typically supported by a wafer support hoop in the EBR chamber.

A typical conventional wafer support hoop 10 is shown in FIG. 1 and includes a circular frame 12 fitted with typically at least three triangle-shaped wafer support pins 14. As shown in FIG. 1A, the wafer 16 rests on the wafer support pins 14, with the patterned surface of the wafer 16 in contact with the upper surfaces of the wafer support pins 14. One of the problems inherent in the conventional wafer support hoop 10 is that, due to the large surface area of the wafer 16 in contact with each of the wafer support pins 14, a large quantity of residual particles tend to accumulate on the wafer support pins 14. Consequently, particle-induced defects frequently form in the patterned surface of the wafer 16. For example, the particles tend to scratch or peel the wafer 16 upon inadvertent movement of the wafer 16 on the wafer support pins 14 during the EBR process, as well as upon positioning or removal of the wafer 16 on or from the wafer support pins 14. Accordingly, a new and improved wafer support for an EBR chamber is needed which minimizes or eliminates contact between the patterned surface of the wafer and the wafer support elements.

An object of the present invention is to provide a new and improved device for supporting a wafer in a process chamber.

Another object of the present invention is to provide a new and improved wafer support which prevents contamination or formation of defects on a wafer during support of the wafer in a process chamber.

Still another object of the present invention is to provide a new and improved wafer support which may be adapted for use in electroplating systems for semiconductor fabrication.

Yet another object of the present invention is to provide a new and improved wafer support which includes multiple gripping elements that engage the edges or bevels of a wafer to prevent or minimize contact of the wafer support with the patterned surface on the wafer.

A still further object of the present invention is to provide a new and improved wafer support which includes multiple gripping elements that may be moved into engagement with the edges of a wafer to support the wafer in a process chamber while substantially minimizing contact with the patterned surface on the wafer.

Yet another object of the present invention is to provide a new and improved wafer support which may include multiple wafer-gripping elements that engage the bevel or edge of a wafer at different locations on the wafer bevel or edge to support the wafer in a process chamber.

SUMMARY OF THE INVENTION

In accordance with these and other objects and advantages, the present invention is generally directed to a new and improved wafer support for supporting wafers in a process chamber such as an edge bead removal (EBR) chamber. The wafer support comprises multiple wafer support units each including a gripper block that engages an edge portion or bevel of the wafer. The gripper block is attached to an engaging and disengaging mechanism for selectively causing engagement of the gripper blocks with the wafer to support the wafer and disengagement of the gripper blocks from the wafer to release the wafer for removal of the wafer from the chamber. The gripper blocks contact little or none of the surface area on the patterned surface of the wafer to prevent or substantially reduce the formation of contact-induced defects on the wafer.

BRIEF DESCRIPTION OF THE DRAWINGS

The invention will now be described, by way of example, with reference to the accompanying drawings, in which:

FIG. 1 is a top view of a conventional wafer support hoop for supporting a wafer in a process chamber;

FIG. 1A is a perspective view of a wafer support pin of the conventional wafer support hoop shown in FIG. 1, with a wafer (partially in section) shown supported by the wafer support pin;

FIG. 2 is a perspective view of a wafer support unit of the wafer support of the present invention, with the wafer support unit shown in the wafer-disengaging configuration;

FIG. 2A is a perspective view of a wafer support unit of the wafer support of the present invention, with the wafer support unit shown in the wafer-engaging configuration;

FIG. 3 is a top view of a wafer support unit, with the wafer support unit shown in the wafer-disengaging configuration;

FIG. 4 is a side view, partially in section, of a gripper arm element of the wafer support unit;

DESCRIPTION OF THE PREFERRED EMBODIMENTS

The present invention has particularly beneficial utility in supporting a semiconductor wafer in an EBR (edge bead removal) chamber of an electroplating system for the fabrication of semiconductor wafers. However, the invention is not so limited in application, and while references may be made to such EBR chamber, the present invention may be more generally applicable to supporting semiconductor wafers in other types of process chambers, as well as other substrates in a variety of industrial and mechanical applications.

Figure 8:
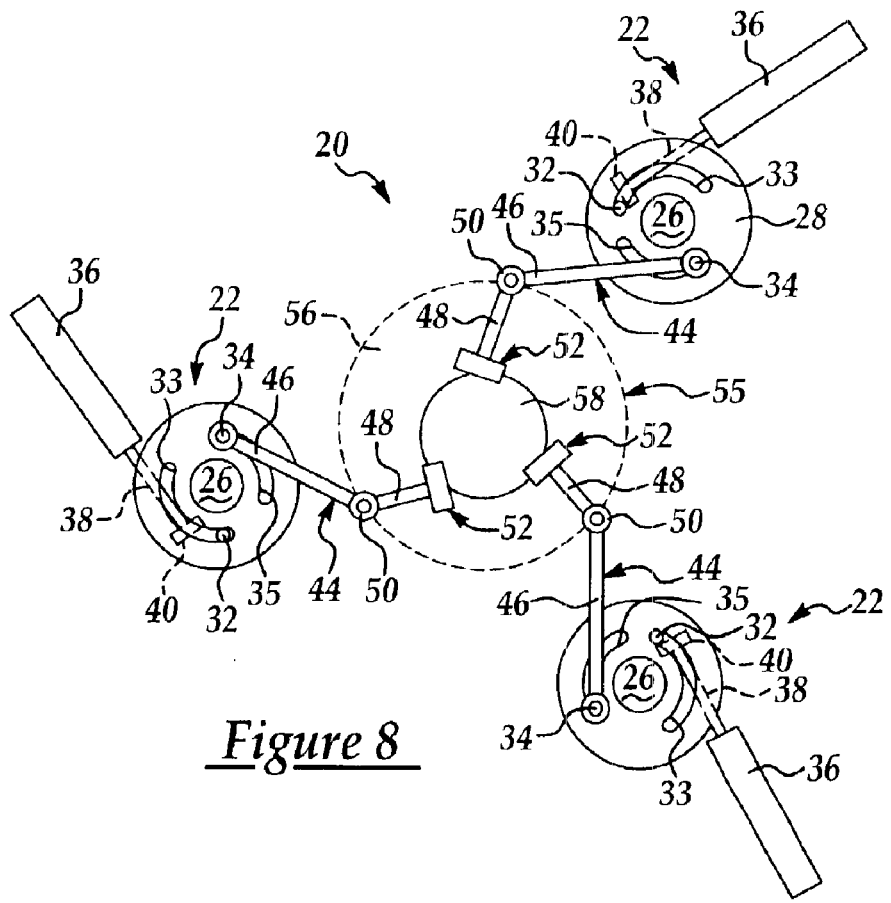
FIG. 8 is a top view of a typical embodiment of the wafer support of the present invention, incorporating three of the wafer support units.

Referring initially to FIG. 8, an illustrative embodiment of the wafer support 20 of the present invention typically includes at least three wafer support units 22 which are collectively adapted for supporting a wafer 58 in an EBR chamber 55. However, it is understood that the invention may include four or more of the wafer support units 22. The wafer support units 22 are spaced around the EBR chamber 55 in such a manner as to engage or grip respective edge portions of the wafer 58 and securely support the wafer 58 in the chamber 55 during processing, as hereinafter described. As shown in FIGS. 2 and 2A, each of the wafer support units 22 may be similar in construction and includes a base 24 which is rotatably mounted on a shaft 26. A piston 38 is selectively extendible from an actuating cylinder 36, which may be air-actuated or fluid-actuated, and the extending end of the piston 38 is terminated by a piston attachment flange 40 that engages the base 24. A stabilizing shaft 32 and an arm mount shaft 34 extend upwardly from the base 24, typically in substantially diametrically-opposed relationship to each other. A fixed plate 28 is mounted on the shaft 26 above the base 24. A generally arcuate stabilizing shaft slot 33 and a generally arcuate arm mount shaft slot 35 extend through the fixed plate 28 and receive the upwardly-extending stabilizing shaft 32 and arm mount shaft 34, respectively. A spring mount rod 30 extends downwardly from the bottom surface of the fixed plate 28, in spaced-apart relationship to the arm mount shaft 34. A coiled tensioning spring 42 connects the spring mount rod 30 to the arm mount shaft 34 for purposes which will be hereinafter described.

Figure 5:
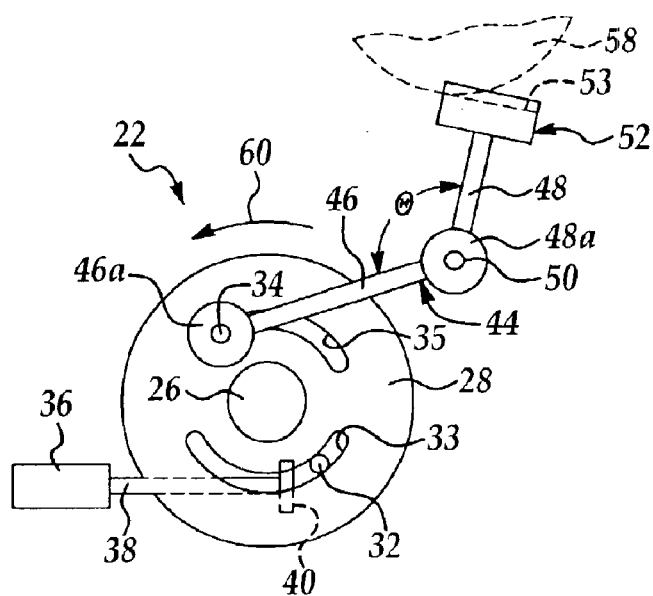
FIG. 5 is a top view of a wafer support unit, with the wafer support unit shown in the wafer-engaging configuration.

As shown in FIGS. 3–5, a gripper arm 44 is mounted on the arm mount shaft 34. The gripper arm 44 is typically disposed beneath the bottom 56 of the chamber 55, as shown in FIG. 4, and may be characterized by a toggle-linkage that includes a proximal arm segment 46, having an arm collar 46a which is attached to the arm mount shaft 34 in non-rotatable relationship thereto. As shown in FIG. 4, a distal arm segment 48 includes an arm collar 48a which receives a pivot pin 50 that extends through a registering arm collar 46b on the distal end of the proxmial arm segment 46. A gripper block flange 51 extends upwardly from the distal end portion of the distal arm segment 48 and slidably traverses a slot 57 that extends through the bottom 56 of the EBR chamber 55. A water-tight seal (not shown) is provided between the gripper block flange 51 and the chamber bottom 56 at the edges of the slot 57, according to the knowledge of those skilled in the art, to prevent leakage of water or cleaning solution from the chamber 55.

A gripper block 52, which may have an elongated, generally rectangular shape, is mounted on the gripper block flange 51, above the chamber bottom 56. The gripper block 52 is constructed of a soft, pliable plastic or rubber material and includes a longitudinal wafer groove 53. In a preferred embodiment, the gripper block 52 has a height "A", shown in FIG. 4, of typically about 1 cm and a thickness "B" of typically about 1–1.5 cm. The length or longitudinal dimension of the gripper block 52 is typically about 3 cm, and the depth of the wafer groove 53 is typically from about 0.5 cm to about 1 cm. However, it is understood that the gripper block 52 may have other dimensions without departing from the spirit and scope of the invention.

Figure 6:
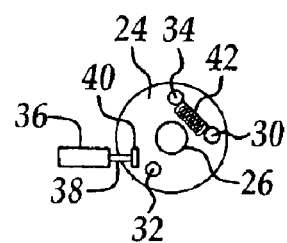
FIG. 6 is a cross-sectional view, taken along section lines 6—6 in FIG. 2.
Figure 7:
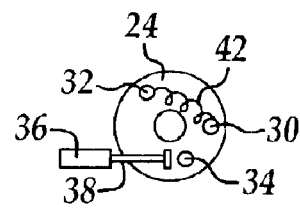
FIG. 7 is a cross-sectional view, taken along section lines 7—7 in FIG. 2A.

In typical operation of the wafer support 20, the multiple wafer support units 22 are typically operated in concert with each other to simultaneously engage and support a wafer 58 in the EBR chamber 55 for EBR processing and disengage the wafer 58 during subsequent removal of the wafer 58 from the chamber 55 after processing, as follows. Accordingly, although the multiple wafer support units 22 operate in conjunction with each other, each of the wafer support units 22 is operated in the following manner. As shown in FIG. 3, when the piston 38 is retracted into the actuating cylinder 36, the gripper arm 44 is positioned in such a manner that the distal arm segment 48 is disposed at an acute angle "θ" with respect to the proxmial arm segment 46 and the gripper block 52 is disengaged from the wafer 58. At that time, the wafer 58 is held in place in the chamber 55 typically by a wafer transfer robot (not shown), in conventional fashion. As the piston 38 is extended from the actuating cylinder 36, as shown in FIG. 5, the blase 24 is rotated typically in the counterclockwise direction, as indicated by the arrow 60, such that the arm mount shaft 34 traverses the arcuate arm mount shaft slot 35. Simultaneously, and in like manner, the stabilizing shaft 32 traverses the stabilizing shaft slot 33 and facilitates smooth movement of the arm mount shaft 34 in the arm mount shaft slot 35. Furthermore, the tensioning spring 42, normally in the flaccid configuration of FIGS. 2 and 6 and biasing the gripper arm 44 and gripper block 52 in the wafer-disengaging position, is tensioned or stretched between the moving arm mount shaft 34 and the stationary spring mount rod 30, as shown in FIGS. 2A and 7. Consequently, the gripper block 52 approaches the wafer 58 until the wafer groove 53 of the gripper block 52 receives the edge of the wafer 58. Continued movement of the arm mount shaft 34 in the arm mount shaft slot 35 in the direction of the arrow 60 in FIG. 5 causes the gripper block 52 to securely engage the edge of the wafer 58 in the wafer groove 53. Therefore, the resistance imparted against the gripper block 52 by the stationary wafer 58, in combination with continued movement of the arm mount shaft 34 in the arm mount shaft slot 35, causes the distal arm segment 48 to pivot on the pivot pin 50 until the distal arm segment 48 is disposed at an obtuse angle "θ" with respect to the proximal arm segment 46 and the wafer groove 53 rides along the edge of the wafer 58 until the edge portion of the wafer groove 53 in the gripper block 52 receives the edge of the wafer 58, as shown in FIG. 5. It will be appreciated from a consideration of FIG. 4 that the gripper block 52 contacts the wafer 58 at both the upper and lower edges thereof, and little or no contact is made between the gripper block 52 and the upper and lower surfaces of the wafer 58. At that point, the wafer transfer robot (not shown) releases the wafer 58, which is securely supported by the gripper blocks 52 of the respective wafer support units 22, as shown in FIG. 8. During an EBR process, the wafer 58 is typically subjected to a three-step process in which the wafer 58 is rinsed with water, solvent and water, respectively. After completion of the EBR or other process, the wafer transfer robot again engages the wafer 58, after which the piston 38 of the wafer support uflit 22 is retracted into the actuating cylinder 36. This action, imparted by the retracting piston 38 under assistance by the contracting tensioning spring 42, facilitates typically clockwise rotation of the base 24, as indicated by the arrow 61 in FIG. 3, in such a manner that the stabilizing shaft 32 and the arm mount shaft 34 traverse the respective stabilizing shaft slot 33 and arm mount shaft slot 35, the distal arm segment 48 pivots with respect to the proximal arm segment 46 to define the acute angle "θ" shown in FIG. 3, and the gripper block 52 disengages the edge or bevel of the wafer 58. Finally, the wafer transfer robot removes the wafer 58 from the chamber 55, typically in conventional fashion.

While the preferred embodiments of the invention have been described above, it will be recognized and understood that various modifications can be made in the invention and the appended claims are intended to cover all such modifications which may fall within the spirit and scope of the invention.

What is claimed is:

1. A wafer support comprising at least three wafer support units for supporting a wafer, said at least three. wafer support units each comprising:
   a shaft;
   a base rotatably carried by said shaft;
   a base-rotating mechanism operably engaging said base for rotating said base between first and second positions;
   a bias mechanism engaging said base for biasing said base in said second position;
   a gripper arm carried by said base; and
   a gripper block carried by said gripper arm for engaging the wafer in said first position and disengaging the wafer in said second position.

2. The wafer support of claim 1 wherein said base-rotating mechanism comprises an actuating cylinder and a piston reversibly extendible from said actuating cylinder and engaging said base.

3. The wafer support of claim 1 further comprising a fixed plate having an arm mount shaft slot fixedly carried by said shaft in spaced-apart relationship to said base and an arm mount shaft extending from said base and engaging said arm mount shaft slot, and wherein said gripper arm is carried by said arm mount shaft.

4. The wafer support of claim 3 wherein said fixed plate has a stabilizing shaft slot and further comprising a stabilizing shaft extending from said base and engaging said stabilizing shaft slot.

5. The wafer support of claim 2 wherein said actuating cylinder comprises an air cylinder.

6. The wafer support of claim 5 further comprising a fixed plate having an arm mount shaft slot fixedly carried by said shaft in spaced-apart relationship to said base and an arm mount shaft extending from said base and engaging said arm mount shaft slot, and wherein said gripper arm is carried by said arm mount shaft.

7. The wafer support of claim 3 wherein said bias mechanism comprises a tensioning spring engaging said fixed plate and said arm mount shaft for normally biasing said base in said second position.

8. The wafer support of claim 7 wherein said base-rotating mechanism comprises an actuating cylinder and a piston reversibly extendible from said actuating cylinder and engaging said base.

9. The wafer support of claim 8 wherein said actuating cylinder comprises an air cylinder.

10. The wafer support of claim 2 wherein said actuating cylinder comprises an air cylinder.

11. The wafer support of claim 10 further comprising a fixed plate having an arm mount shaft slot fixedly carried by said shaft in spaced-apart relationship to said base and an arm mount shaft extending from said base and engaging said arm mount shaft slot, and wherein said gripper arm is carried by said arm mount shaft.

12. The wafer support of claim 11 wherein said bias mechanism comprises a tensioning spring engaging said fixed plate and said arm mount shaft for normally biasing said base in said second position.

13. A wafer support comprising at least three wafer support units for supporting a wafer, said at least three wafer support units each comprising:
   a shaft;
   a base rotatably carried by said shaft;
   a fixed plate having an arm mount shaft slot fixedly carried by said shaft in spaced-apart relationship to said base;
   an arm mount shaft extending from said base and engaging said arm mount shaft slot;
   a base-rotating mechanism operably engaging said base for rotating said base between first and second positions;
   a gripper arm carried by said arm mount shaft; and
   a gripper block carried by said gripper arm and having a generally V-shaped wafer groove for receiving the wafer in said first position and releasing the wafer in said second position.

14. The wafer support of claim 13 wherein said base-rotating mechanism comprises an actuating cylinder and a piston reversibly extendible from said actuating cylinder and engaging said base.

15. The wafer support of claim 13 further comprising a tensioning spring engaging said fixed plate and said arm mount shaft for normally biasing said base in said second position.

16. A wafer support comprising at least three wafer support units for supporting a wafer, said at least three wafer support units each comprising:
   a shaft;
   a base rotatably carried by said shaft;
   a bias mechanism engaging said base for biasing said base in said second position;
   a base-rotating mechanism operably engaging said base for rotating said base between first and second positions;
   a gripper arm having a proximal arm segment carried by said base and a distal arm segment pivotally carried by said proximal arm segment; and
   a gripper block carried by said distal arm segment of said gripper arm for engaging the wafer in said first position and disengaging the wafer in said second position.

17. The wafer support of claim 16 wherein said base-rotating mechanism comprises an actuating cylinder and a piston reversibly extendible from said actuating cylinder and engaging said base.

18. The wafer support of claim 16 further comprising a fixed plate having an arm mount shaft slot fixedly carried by said shaft in spaced-apart relationship to said base and an arm mount shaft extending from said base and engaging said arm mount shaft slot, and wherein said gripper arm is carried by said arm mount shaft.

19. The wafer support of claim 18 wherein said bias mechanism comprises a tensioning spring engaging said fixed plate and said arm mount shaft for normally biasing said base in said second position.

* * * * *